(12) United States Patent
Takiar (10) Patent No.: US 7,094,633 B2
(45) Date of Patent: Aug. 22, 2006

(54) METHOD FOR EFFICIENTLY PRODUCING REMOVABLE PERIPHERAL CARDS

(75) Inventor: Hem P. Takiar, Sunnyvale, CA (US)

(73) Assignee: SanDisk Corporation, Sunnyvale, CA (US)

( * ) Notice: Subject to any disclaimer, the term of this patent is extended or adjusted under 35 U.S.C. 154(b) by 55 days.

(21) Appl. No.: 10/602,373

(22) Filed: Jun. 23, 2003

(65) Prior Publication Data

US 2004/0259291 A1    Dec. 23, 2004

(51) Int. Cl.
*H01L 21/48* (2006.01)

(52) U.S. Cl. .................... 438/113; 438/112; 438/460

(58) Field of Classification Search ............ 438/112, 438/113, 114, 126, 127, 462, 458, 464, 465, 438/111, 460; 257/797, E23.031, E23.037, 257/E23.043, E23.07, E23.123
See application file for complete search history.

(56) References Cited

U.S. PATENT DOCUMENTS

| | | | |
|---|---|---|---|
| 5,490,891 A | 2/1996 | Farquhar et al. .......... 156/73.1 |
| 5,502,289 A | 3/1996 | Takiar et al. ............. 174/266 |
| 5,596,225 A | 1/1997 | Mathew et al. ........... 257/667 |
| 5,663,901 A | 9/1997 | Wallace et al. ............ 365/52 |
| 5,877,544 A | 3/1999 | Rigal et al. .............. 257/679 |
| 5,933,328 A | 8/1999 | Wallace et al. ........... 361/737 |
| 6,085,412 A | 7/2000 | Iwasaki ................... 29/827 |
| 6,151,248 A | 11/2000 | Harari et al. .......... 365/185.14 |
| 6,235,555 B1 * | 5/2001 | Cho ..................... 438/112 |
| 6,323,064 B1 | 11/2001 | Lee et al. ............... 438/117 |
| 6,333,517 B1 | 12/2001 | Tamaki ................... 257/48 |
| 6,368,899 B1 * | 4/2002 | Featherby et al. ......... 438/127 |
| 6,372,539 B1 | 4/2002 | Bayan et al. ............ 438/106 |
| 6,399,415 B1 * | 6/2002 | Bayan et al. ............ 438/106 |
| 6,410,355 B1 | 6/2002 | Wallace ................. 438/15 |
| 6,444,501 B1 * | 9/2002 | Bolken .................. 438/127 |
| 6,456,528 B1 | 9/2002 | Chen .................. 365/185.03 |
| 6,489,218 B1 * | 12/2002 | Kim et al. .............. 438/460 |
| 6,537,842 B1 | 3/2003 | Akram .................. 438/48 |
| 6,624,005 B1 | 9/2003 | DiCaprio et al. .......... 438/113 |
| 6,677,183 B1 * | 1/2004 | Sakaguchi et al. ......... 438/113 |
| 6,705,925 B1 * | 3/2004 | Cole et al. .............. 451/36 |
| 2004/0018667 A1 * | 1/2004 | Joshi et al. ............. 438/126 |
| 2004/0058478 A1 * | 3/2004 | Islam et al. ............. 438/123 |

(Continued)

FOREIGN PATENT DOCUMENTS

WO    WO02/069251 A1    9/2002

OTHER PUBLICATIONS

The MultiMedia Card System Summary, Version 3.2, MMCA Technical Committee, Jan. 2002.

(Continued)

*Primary Examiner*—George Fourson
*Assistant Examiner*—Julio J. Maldonado
(74) *Attorney, Agent, or Firm*—Beyer Weaver & Thomas, LLP (57) ABSTRACT

Improved techniques to produce integrated circuit products are disclosed. The improved techniques permit smaller and less costly production of integrated circuit products. One aspect of the invention is that the integrated circuit products are produced a batch at a time, and that singulation of the batch into individualized integrated circuit products uses a non-linear (e.g., non-rectangular or curvilinear) sawing or cutting action so that the resulting individualized integrated circuit packages no longer need to be completely rectangular. Another aspect of the invention is that the integrated circuit products can be produced with semiconductor assembly processing such that the need to provide an external package or container becomes optional.

51 Claims, 6 Drawing Sheets

U.S. PATENT DOCUMENTS

2004/0090829 A1   5/2004   Miura et al. ................. 365/200
2004/0229401 A1*  11/2004  Bolken et al. .............. 438/109

OTHER PUBLICATIONS

High Capacity and Small Size, Meeting the Storage Needs of Today's Portable Devices, 2003 SanDisk Corporation.

Dean et al., "New Fine-Beam, Abrasive Water Jet Technology Enables Photonic and Small Device Singulation," Chip Scale Review, Aug./Sep. 2002, pp. 43, 45, 47.

U.S. Appl. No. 10/621,882, by Hem P. Takiar, filed Jul. 17, 2003.

* cited by examiner

METHOD FOR EFFICIENTLY PRODUCING REMOVABLE PERIPHERAL CARDS

CROSS-REFERENCE TO RELATED APPLICATION

This application is related to U.S. patent application Ser. No. 10/621,882, filed Jul. 17, 2003, and entitled "PERIPHERAL CARD WITH HIDDEN TEST PINS", and which is hereby incorporated by reference herein.

BACKGROUND OF THE INVENTION

1. Field of the Invention

The present invention relates to integrated circuit products and, more particularly, to removable peripheral cards that contain one or more integrated circuits.

2. Description of the Related Art

As the trend for memory integrated circuit (IC) packages to be smaller and their memory density to be larger continues, advancements in packaging integrated circuits are needed. One recent advancement involves stacking multiple integrated circuit dies within a single IC package. Such internal package stacking involves stacking a smaller die on a larger die. Each of the dies is wire bonded to a substrate. This type of stacking has, for example, been used with same function dies (e.g., two Flash memory dies) or different function dies (e.g., one Flash memory die and one SRAM die). Additionally, stacking of two or three dies has been done for stacked Chip Scale Packages (stacked CSP) and stacked Thin Small Outline Packages (TSOP).

Memory cards are commonly used to store digital data for use with various products (e.g., electronic products). These memory cards are increasingly called on to store greater and greater amounts of data. Memory cards normally provide non-volatile data storage, and thus such memory cards are very popular and useful because they retain data even after being powered-off. Examples of memory cards are Flash cards that use Flash type or EEPROM type memory cells to store the data. Flash cards have a relatively small form factor and have been used to store digital data for products such as cameras, computers (hand-held, notebook and desktop computers), set-top boxes, hand-held or other small audio players/recorders (e.g., MP3 devices), and medical monitors. A major supplier of Flash cards is SanDisk Corporation of Sunnyvale, Calif.

Unfortunately, the manufacturing of high density memory cards having a relatively small form factor is complicated. One complication is that the final form factor of memory cards is irregular, namely, not rectangular. The irregular form factor can serve various purposes, such as restricting its connection to a connector or port in a particular orientation, providing a position reference or a lock position, etc. However, integrated circuit assemblies conventionally have a regular, namely, a rectangular, shape and also have to be protected from users. Thus, conventionally, memory cards have an irregular form factor defined by a lid, frame or outer package that encompasses the regular shape of the integrated circuit assemblies. The lid, frame or outer package is often made of plastic. A further problem with the irregular form factor is that the assembly of the lid, frame or outer package about the integrated circuit assembly is not a semiconductor manufacturing process and thus must be done in a separate production line, in perhaps a different manufacturing facility.

Thus, there is a need for improved approaches to manufacture memory cards having small form factors.

SUMMARY OF THE INVENTION

Broadly speaking, the invention relates to improved techniques to produce integrated circuit products. The improved techniques permit smaller and less costly production of integrated circuit products. One aspect of the invention is that the integrated circuit products are produced a batch at a time, and that singulation of the batch into individualized integrated circuit products uses a non-linear (e.g., non-rectangular or curvilinear) sawing or cutting action so that the resulting individualized integrated circuit packages no longer need to be completely rectangular. Another aspect of the invention is that the integrated circuit products can be produced with semiconductor assembly processing such that the need to provide an external package or container becomes optional.

The integrated circuit products can pertain to removable peripheral cards or other removable media formed using semiconductor assembly techniques. One type of removable peripheral card is referred to as a memory card. Memory cards are typically small, integrated circuit-based products that provide data storage. These memory cards plug into or are received by ports or connectors on electronic devices, including computers, cameras, mobile phones and PDAs.

The invention can be implemented in numerous ways, including as a system, apparatus, device or method. Several embodiments of the invention are discussed below.

As a method for concurrently forming a plurality of integrated circuit products, one embodiment of the invention includes at least the acts of: providing a multi-instance leadframe or substrate having a plurality of instances; attaching one or more dies to each of the instances on at least one side of the multi-instance leadframe or substrate; electrically connecting each of the one or more dies to the respective instance of the leadframe or substrate; encapsulating together the plurality of instances on the at least one side of the multi-instance leadframe or substrate with a molding compound; and singulating each of the plurality of instances using at least non-linear shaping, thereby forming the integrated circuit products.

As an integrated circuit product produced in a batch by the operations that, according to one embodiment, include at least the acts of: providing a multi-instance leadframe or substrate having a plurality of instances; attaching one or more dies to each of the instances on at least one side of the multi-instance leadframe or substrate; electrically connecting each of the one or more dies to the respective instance of the leadframe or substrate; encapsulating together the plurality of instances on the at least one side of the multi-instance leadframe or substrate with a molding compound; and singulating each of the plurality of instances using at least non-linear shaping, whereby one of the plurality of instances being produced by the operations is the integrated circuit product.

As a method for concurrently forming a plurality of memory cards, each of the memory cards including at least a memory die and a controller die, one embodiment of the invention includes at least the acts of: providing a multi-instance leadframe having a plurality of instances; attaching the multi-instance leadframe on a removable tape; placing die attach material on a portion of each of the instances of the multi-instance leadframe; attaching the memory die to each of the instances via the die attach material corresponding to each of the instances; affixing the controller die with respect to each of the instances; electrically connecting each of the memory die and the controller die to the respective instances of the multi-instance leadframe; thereafter encapsulating together the instances with a molding compound; and subsequently singulating each of the instances using at least non-linear shaping.

As a method for concurrently forming a plurality of memory cards, each of the memory cards including at least a memory die and a controller die, one embodiment of the invention includes at least the acts of: providing a multi-instance printed circuit board having a plurality of instances; attaching the memory die with respect to each of the instances; affixing the controller die with respect to each of the instances; electrically connecting each of the memory die and the controller die to the respective instances of the multi-instance printed circuit board; thereafter encapsulating together the instances with a molding compound; and subsequently singulating each of the instances using at least non-rectangular shaping.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention pertains to improved techniques to produce integrated circuit products. The improved techniques permit smaller and less costly production of integrated circuit products. One aspect of the invention is that the integrated circuit products are produced a batch at a time, and that singulation of the batch into individualized integrated circuit products uses non-linear (e.g., non-rectangular or curvilinear) sawing or cutting action so that the resulting individualized integrated circuit packages no longer need to be completely rectangular. Another aspect of the invention is that the integrated circuit products can be produced with semiconductor assembly processing such that the need to provide an external package or container becomes optional.

The integrated circuit products can be formed using semiconductor assembly techniques. The integrated circuit products can also have a reduced form factor. The reduced form factor can be on the order of chip scale packaging. Further, the form factor can be defined at the semiconductor assembly level of semiconductor manufacturing.

The integrated circuit products can pertain to removable peripheral cards. The removable peripheral cards can serve many applications and perform many different functions. One type of removable peripheral card is referred to as a memory card. Memory cards are typically small, integrated circuit-based products that provide data storage. These memory cards plug into or are received by ports or connectors on electronic devices, including computers, cameras, mobile phones and PDAs. The memory cards can be non-volatile memory cards. The memory card can contain multiple integrated circuit chips stacked on one or both sides of a substrate or leadframe.

Embodiments of this aspect of the invention are discussed below with reference to FIGS. 1A–5B. However, those skilled in the art will readily appreciate that the detailed description given herein with respect to these figures is for explanatory purposes as the invention extends beyond these limited embodiments.

Figure 1A:
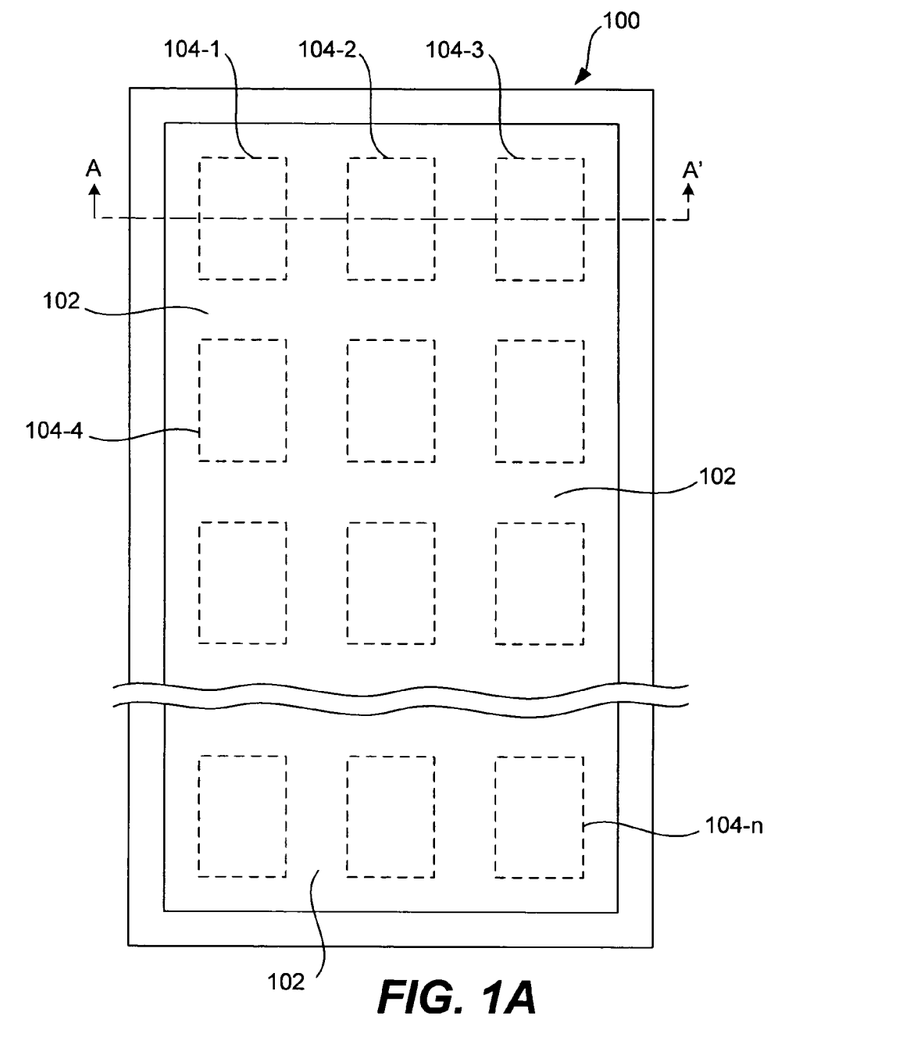
FIG. 1A is a plan view of a manufactured semiconductor product.

FIG. 1A is a plan view of a manufactured semiconductor product. The base of the manufactured semiconductor product is a multi-instance substrate 100. The multi-instance substrate 100 has a molding compound 102 that encapsulates circuitry (namely, semiconductor dies) provided at each of a plurality of instances 104 of an integrated circuit product. The instances 104 of the integrated circuit product are denoted as 104-1, 104-2, 104-3, 104-4, . . . , 104-n. Each of the instances 104 represents an integrated circuit product. In other words, the manufactured semiconductor product has an array of integrated circuit products. Hence, when the multi-instance substrate 100 is processed to form the instances 104 thereon, the integrated circuit products are able to be fabricated in a batch mode.

Figure 1B:
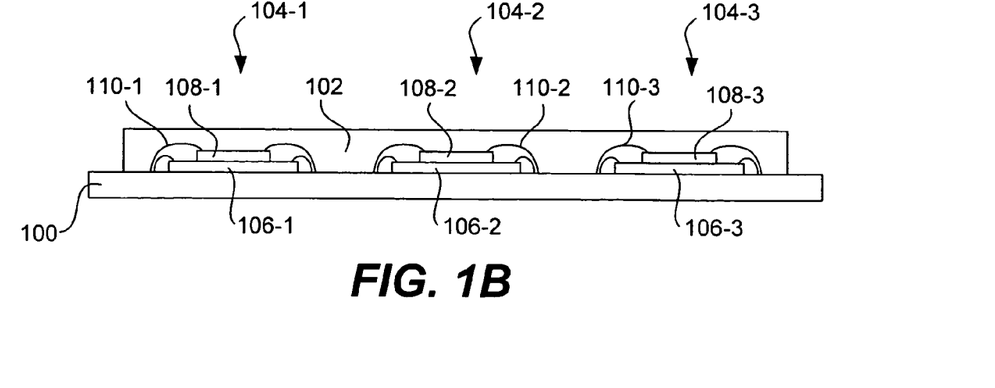
FIG. 1B is a cross-sectional view of a manufactured semiconductor product taken with respect to a reference line A–A' illustrated in FIG. 1A.

FIG. 1B is a cross-sectional view of a manufactured semiconductor product taken with respect to a reference line A–A' illustrated in FIG. 1A. In FIG. 1B, each of the instances 104-1, 104-2 and 104-3 includes a first semiconductor die 106-1, 106-2 and 106-3, respectively. The integrated circuit dies 106 are mounted on the multi-instance substrate 100. In one embodiment, the multi-instance substrate 100 represents or corresponds to a Printed Circuit Board (PCB). In addition, each of the instances 104-1, 104-2 and 104-3 can include a second semiconductor die 108-1, 108-2 and 108-3, respectively. As shown in FIG. 1B, the second semiconductor dies 108 can be stacked on the first semiconductor dies 106. The first semiconductor dies 106 can respectively mount directly on the instances 104 of the multi-instance substrate 100 or attach to the instances 104 of the multi-instance substrate 100 via a die attach or adhesive material. The second semiconductor dies 108 can respectively mount (i.e., stack) directly on the first semiconductor dies 106 or attach to the first semiconductor dies 106 via a die attach material or adhesive material. Still further, in one embodiment, the semiconductor dies 106 and 108 can be respectively electrically connected to the instances 104 of the multi-instance substrate 100 by wire bonds 110. For example, the semiconductor dies 106-1 and 108-1 can be electrically connected to the instance 104-1 of the multi-instance substrate 100 by the wire bonds 110-1.

Hence, through use of the multi-instance substrate 100 and the formation of a plurality of instances of integrated circuit products thereon during manufacturing, the integrated circuit products can be produced in a batch mode, i.e., in parallel. However, when the molding compound 102 is placed over the various instances 104 to encapsulate them, the molded compound 102 forms a unitary structure that covers all the instances 104 with respect to the multi-instance substrate 100. Thereafter, the various instances 104 of the integrated circuit product must be individualized or singulated from the unitary structure. In this regard, the manufactured semiconductor product is sawed or cut into its multiple instances. According to one aspect of the invention, the integrated circuit products are not fully rectangular in their shape, and thus the singulation of the manufactured semiconductor product into the individual instances performs non-linear, such as non-rectangular or curvilinear, sawing. Such sawing can be performed efficiently with a very thin saw width and with high precision and detail, such that the sawing action is very fine.

Figure 2A:
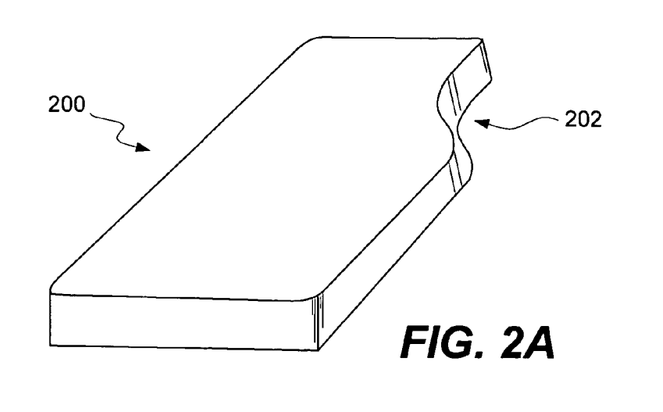
FIGS. 2A and 2B illustrate one representative shape of an integrated circuit product that can be produced according to the invention.
Figure 2B:
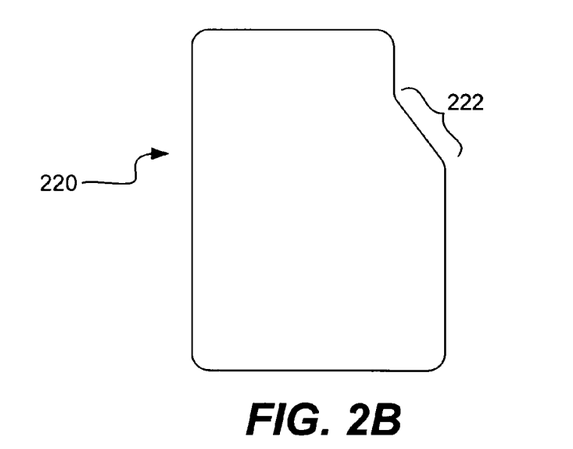

FIGS. 2A and 2B illustrate one representative shape of an integrated circuit product that can be produced according to the invention. In FIG. 2A, an integrated circuit product 200 is depicted having a portion of its external shape having a curvilinear region 202. Hence, when the multiple instances are singulated from a manufactured semiconductor product having a multi-instance substrate and a unitary molding compound, the sawing action needs to be capable of efficiently sawing the manufactured semiconductor product so as to yield the integrated circuit product 200. In this example, the sawing action uses a combination of linear cutting and non-linear cutting. The linear (rectangular) cuts are easily achieved but the non-linear (curved) cuts for the curvilinear region 202 require a sophisticated sawing action as discussed in more detail below.

FIG. 2B is a top view of an integrated circuit product 220 that has a curvilinear region 222. The integrated circuit product 220 is generally similar to the integrated circuit product 200 illustrated in FIG. 2A. However, the curvilinear region 222 of the integrated circuit product 220 has two small rounded areas separated by a ramp, whereas in FIG. 2A the curvilinear region 202 was two rounded areas without a ramp section (e.g., S curve). Even in the case where the two small rounded areas shown in FIG. 2B were to be sharp angles for by intersecting linear cuts, the curvilinear region 202 can be classified as a non-rectangular region.

Figure 2C:
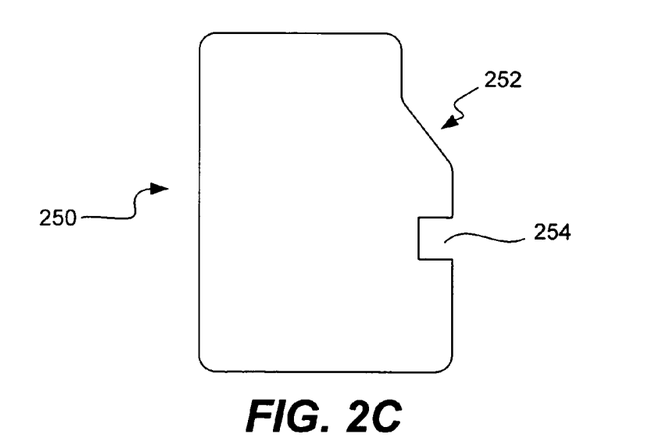
FIG. 2C is a top view of an integrated circuit product according to another embodiment of the invention.

FIG. 2C is a top view of an integrated circuit product 250 according to another embodiment of the invention. The integrated circuit product 250 includes a curvilinear region 252 that is similar to the curvilinear region 222 of the integrated circuit product 220 illustrated in FIG. 2B. Additionally, the integrated circuit product 250 includes a notch 254. The notch 254 is a relatively small detail that is obtained by a sawing action. The notch 254 can serve as a reference point or a catch (e.g., latch-catch) region for the integrated circuit product 250, which may be used when the integrated circuit product 250 is inserted into a connector or receptacle for receiving the same. The small size of the notch 254 requires a precise sawing action in order to be able to yield such a small feature.

Accordingly, the sawing action is able to produce integrated circuit products having curved portions or small features in their external body or form factor. In general, the resulting integrated circuit products are non-rectangular due to at least one portion being curved, multi-faceted or otherwise non-rectangular. The operations for producing such integrated circuit products are further described below.

Figure 3:
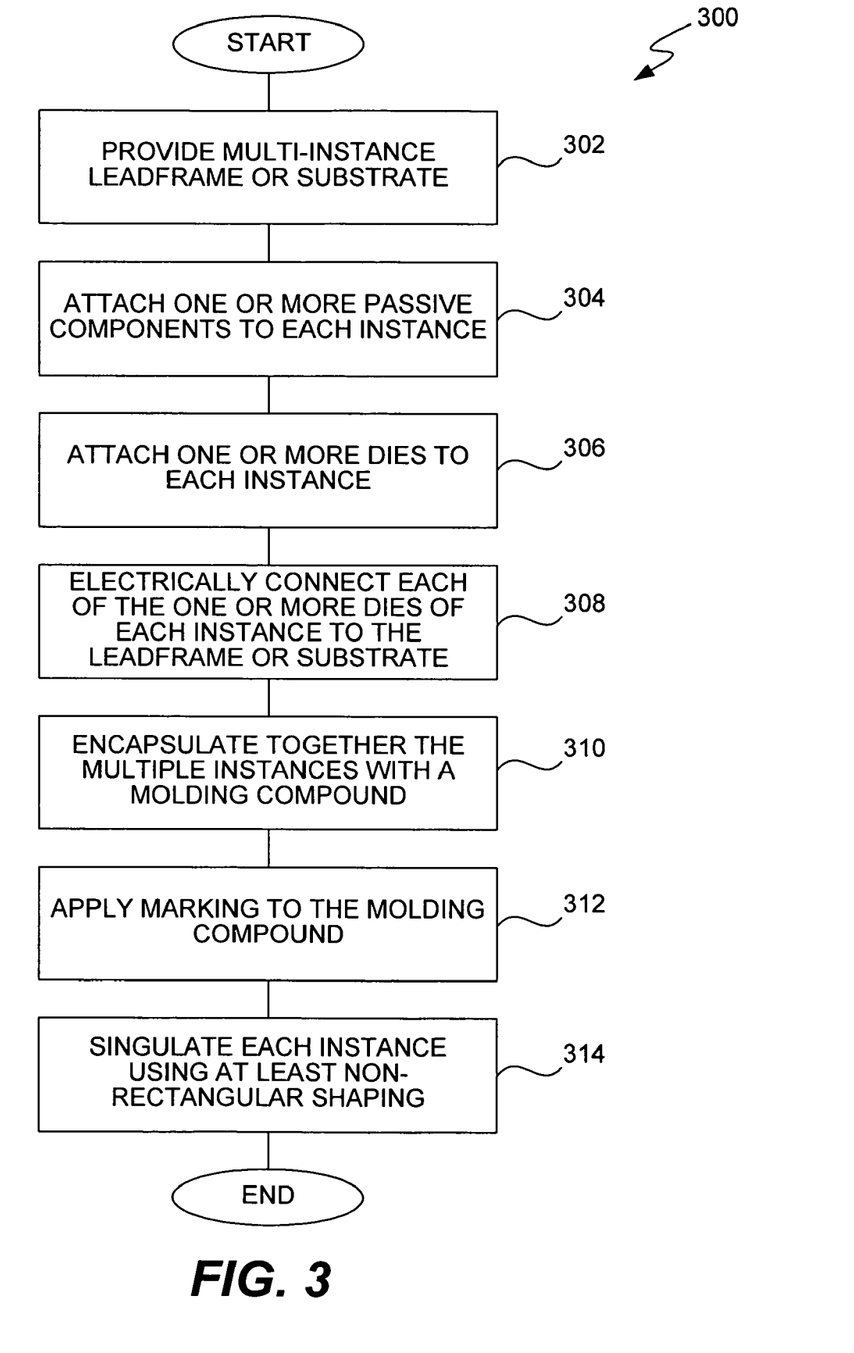
FIG. 3 is a flow diagram of batch integrated circuit product processing according to one embodiment of the invention.

FIG. 3 is a flow diagram of batch integrated circuit product processing 300 according to one embodiment of the invention. The batch integrated circuit product processing 300 operates to produce a plurality of integrated circuit products. For example, the integrated circuit products being produced can be the integrated circuit products illustrated in FIGS. 2A–2C.

The batch integrated circuit product processing 300 initially provides 302 a multi-instance leadframe or substrate. The leadframe or substrate operates to support devices or components of an integrated circuit product for each of a plurality of multiple instances that can be concurrently formed on the leadframe or substrate. In the case of a leadframe, the leadframe is typically a conductive metal, such as copper. In the case of a substrate, the substrate is often a Printed Circuit Board (PCB). For example, in the case of a substrate, the multi-instance substrate can be the multi-instance substrate 100 illustrated in FIG. 1A.

Next, if desired, one or more passive components can be attached 304 to each instance of the multi-instance leadframe or substrate. Here, if the integrated circuit products to be produced are to include one or more passive components, then such passive components can be attached 304 to each instance. Examples of passive components include capacitors and resistors. Additionally, one or more dies (integrated circuit dies) or integrated circuit chips are attached 306 to each of the instances of the multi-instance leadframe or substrate. For each instance, the one or more dies would be attached within the region on the leadframe or substrate corresponding to that instance. The one or more dies can be directly attached to the leadframe or substrate or can be attached to the leadframe or substrate by way of a die attach material or other intermediary. Further, in one embodiment, if multiple dies for an instance are to be attached within the region of the leadframe or substrate corresponding to that instance, then the dies can be attached in a stacked manner, with one die stacked on another. The die stacked on a lower die can be directly attached to the lower die or can be attached to the lower die by way of a die attach material or other intermediary.

After the one or more dies have been attached 306 to each instance, each of the one or more dies of each instance can be electrically connected 308 to a corresponding portion of the leadframe or substrate. In one embodiment, these electrical connections can be provided between wire bonding pads, leads or terminals of the dies and the leadframe or substrate. With wire bonding, for each electrical connection, a small, thin wire extends from the die to the leadframe or substrate and is held in place by solder.

Thereafter, the multiple instances can be encapsulated 310 together with the molding compound. The molding compound is formed as a unitary encapsulation that encompasses each of the instances of the leadframe or substrate. The resulting encapsulation can also be referred to as a molded panel. The molding compound can be applied in various ways, including by transfer molding or flood molding techniques.

Additionally, if desired, marking can be applied 312 to the molding compound. For example, the marking can have a logo or other information printed on the surface of the molding compound for each of the instances. The marking can, for example, indicate manufacturer, trademark, and/or type of device.

Finally, each instance can thereafter be singulated 314 using at least non-rectangular shaping. Here, although the singulation 314 can include rectangular shaping, the shaping of each instance makes use of non-rectangular shaping for at least a portion of each of the instances. This sophisticated shaping can be achieved using a sawing device. The sawing device should have a small cutting width and be able to shape small details.

Examples of sawing devices include, for example, water jet cutting, laser cutting, water guided laser cutting, dry media cutting, and diamond coated wire. Water jet cutting may be the preferred cutting device given its small cutting width (e.g., 50 microns), its ability to shape small features, and its rapid cutting rate. Water can also be used together with laser cutting to help complement or focus its effects. Following the singulation 314, the batch integrated circuit product processing 300 is complete and ends.

Although not shown in FIG. 3, the batch integrated circuit product processing 300 can additionally include other operations as may be desired in certain implementations. For example, after encapsulation 310 but before singulation 314, additional operations can be performed to (i) test the integrated circuit products while they are still in their array configuration, and/or (ii) coat test pins and/or conductive leads or traces for protection and/or wearability. Typically, if provided, the test pins would be formed at each instance of the leadframe or substrate. In one embodiment, after the test pins are used to test each of the integrated circuit products, the test pins can be coated or covered with a protective film or layer (e.g., so as to electrically isolate the test pins). Still further, following singulation 314, each instance may be further shaped to remove or smooth sharp edges. In addition, a polymer coating can be applied to each of the instances, as a protective surface. Yet still further, for each instance, a lidding operation could further be utilized to add an external package or lid (pair of lids) around the integrated circuit product. Such a package or lid would provide an external covering for the integrated circuit product and establish its external product features. For example, when the resulting integrated circuit products are smaller than the desired form factor for the products, then enclosing the integrated circuit products in an external package or lid can scale the integrated circuit product to the desired form factor.

Figure 4:
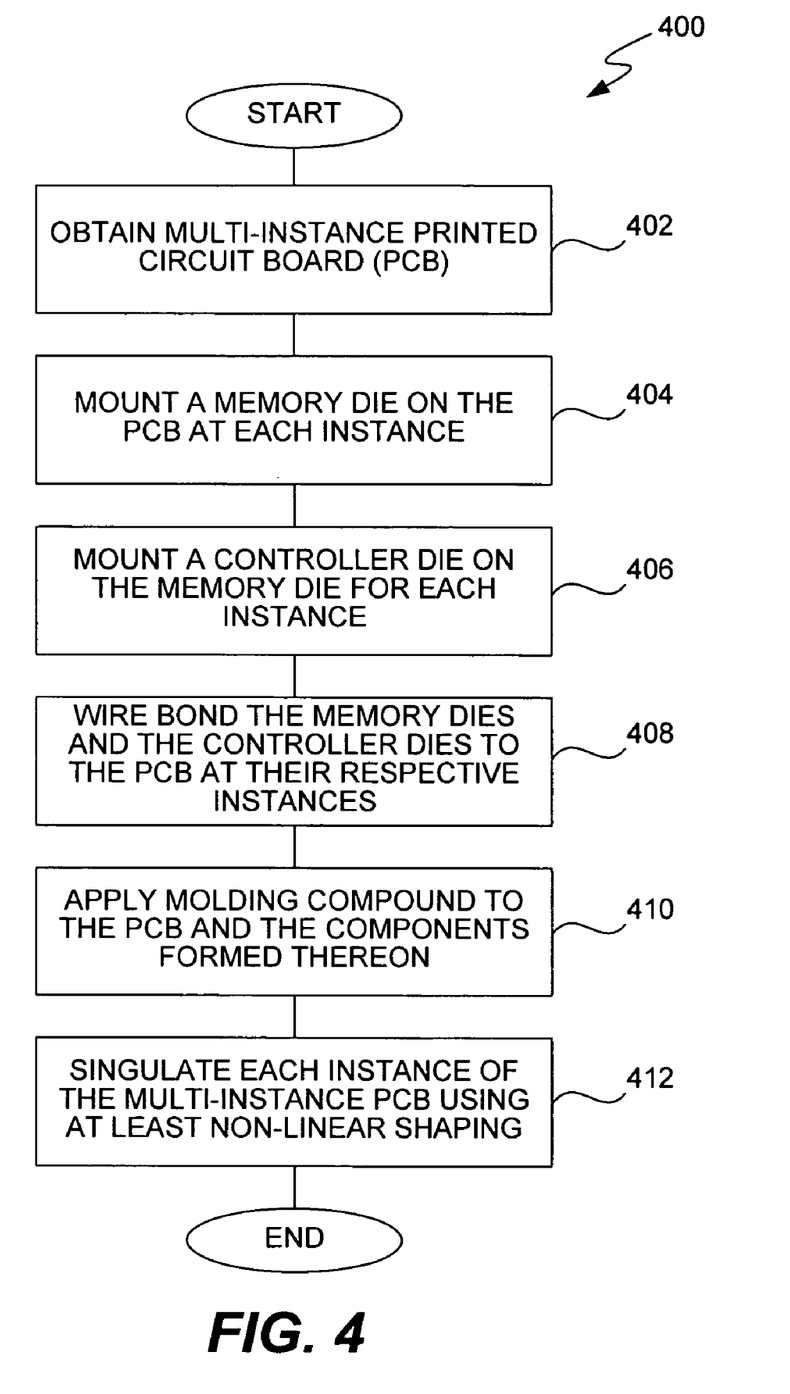
FIG. 4 is a flow diagram of batch memory card processing according to one embodiment of the invention.
Figure 5A:
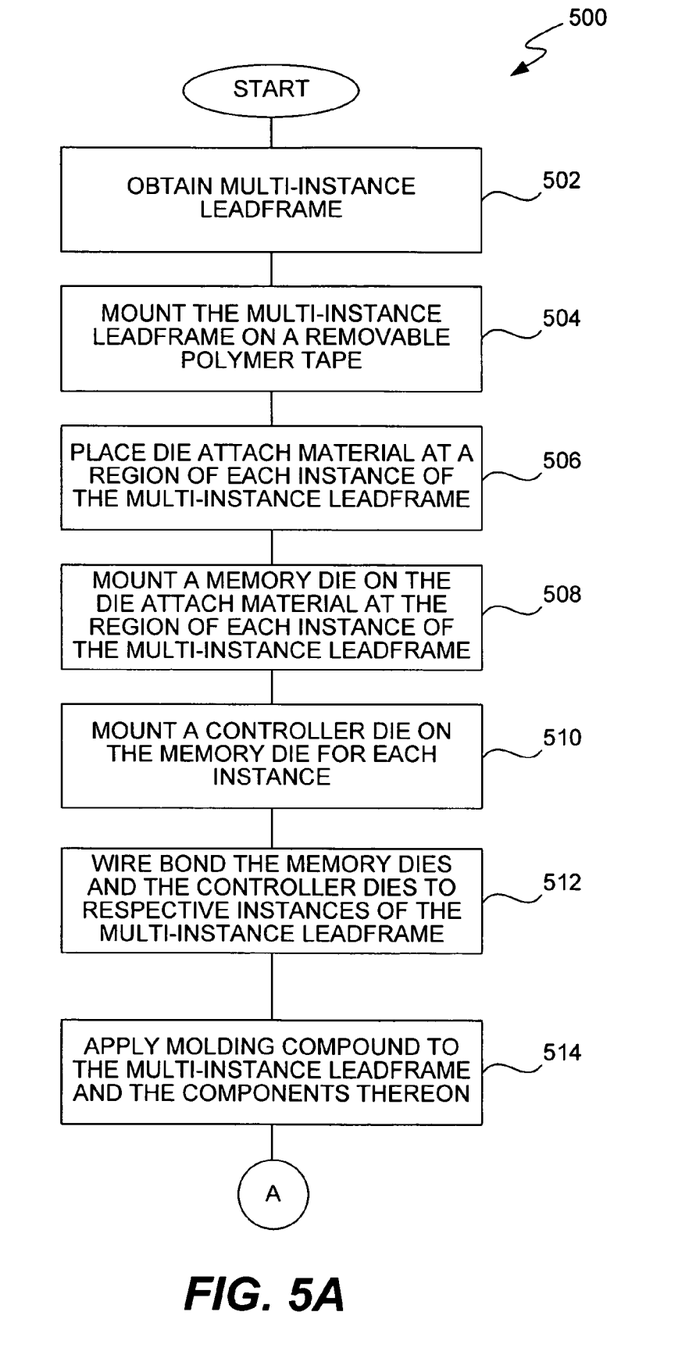
FIGS. 5A and 5B are flow diagrams of batch memory card processing according to another embodiment of the invention.
Figure 5B:
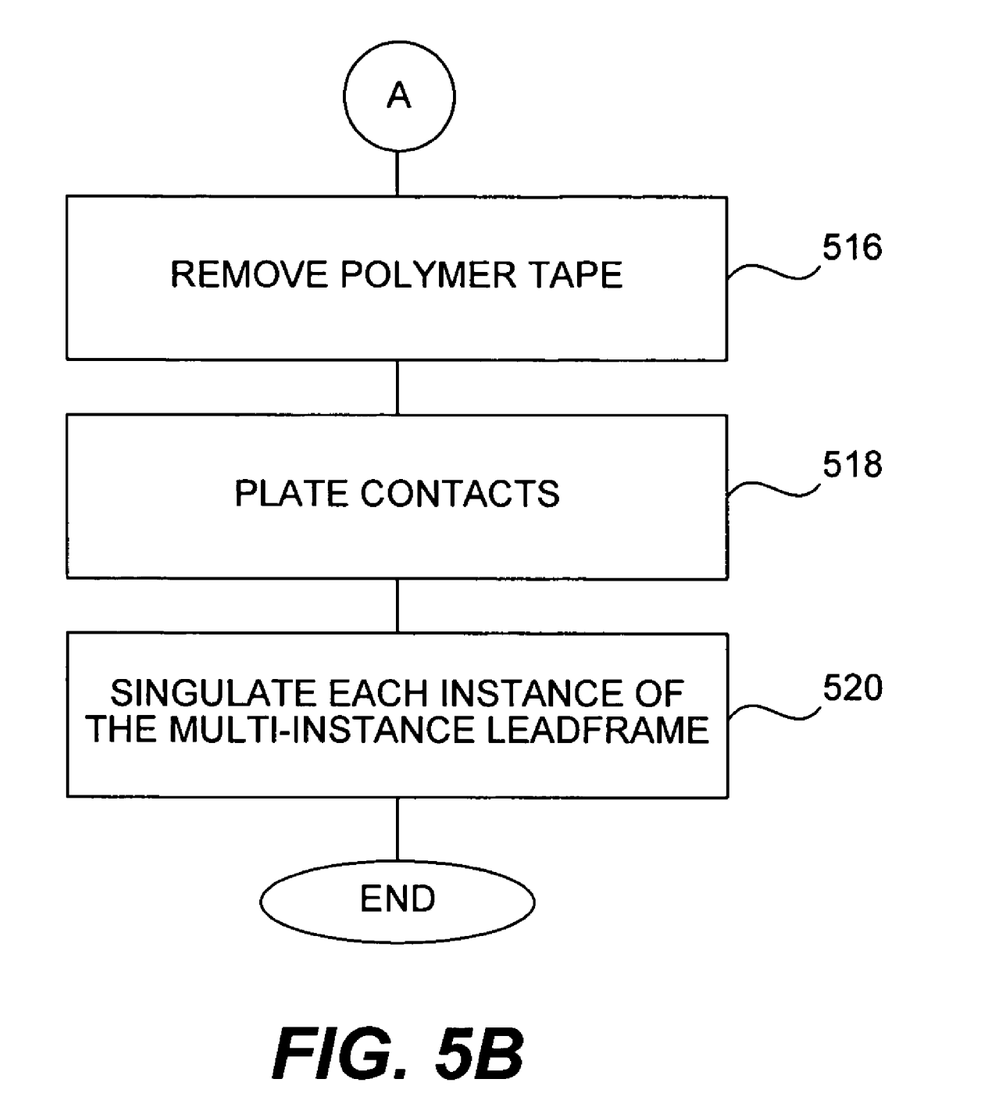

The integrated circuit products can pertain to removable peripheral cards or other removable media formed using semiconductor assembly techniques. One type of removable peripheral card is referred to as a memory card. Memory cards are typically small, integrated circuit-based products that provide data storage. These memory cards plug into or are received by ports or connectors on electronic devices, including computers, cameras, mobile phones and PDAs. FIGS. 4, 5A and 5B are discussed below with reference to memory cards, though other integrated circuit products can be formed from such processing.

FIG. 4 is a flow diagram of batch memory card processing 400 according to one embodiment of the invention. The batch memory card processing 400 uses integrated circuit assembly processing to form a plurality of memory cards a batch at a time. The batch memory card processing 400 initially obtains 402 a multi-instance Printed Circuit Board (PCB). The multi-instance PCB is a laminated structure that includes conductive traces that are used to electrically connect different devices or components that are attached to the PCB. A memory die is mounted 404 on the PCB at each instance. Then, a controller die is mounted 406 on the memory die for each instance. At this point, for each instance, there is a die stack, with the lower die pertaining to the memory die and the upper die pertaining to the controller die. Then, the memory dies and the controller dies are wire bonded 408 to the PCB at their respective instances. The wire bonds serve to electrically connect the memory dies and the controller dies to the PCB.

Thereafter, a molding compound is applied 410 to the PCB and the components formed thereon. Here, the molding compound serves to protect the components and their electrical connections to the PCB as well as to provide an external body for the memory cards. After the molding compound has been set (or cured), each instance of the multi-instance PCB can be singulated 412 using at least non-linear shaping. That is, in the singulation 412 of each of the memory cards, each of four sides are sawed, and in doing so, at least one of the sides includes a curvilinear portion that requires non-linear shaping in order to saw that side. Consequently, the individual instances of the memory cards that are produced in the batch have at least a portion of their housing or external structure having a non-linear shape. In other words, the external structure or housing of the memory cards are not merely rectangular, but include at least one region that has a non-linear (or non-rectangular) shape. For example, in FIG. 2A, the integrated circuit product 200 includes the curvilinear region 202 that would correspond to the non-linear (or non-rectangular) shaped region. Advantageously, the singulation 412 can be performed in the same manufacturing site as the other operations of the batch memory card processing 400. Further, the ability to provide non-linear shaping/cutting beneficially allows the memory cards to be shaped in their final form through such singulation 412. Hence, the external features of the memory cards, which are not merely rectangular (i.e., include at least one curvilinear region), can thus be determined by the sawing/cutting of the singulation 412. Following the singulation 412, the batch memory card processing 400 is complete and ends.

Consequently, a further external package or body (e.g., plastic lid) is not needed and thus the additional steps to form such packages or bodies and then to insert the instances into such packages or bodies are no longer required. Moreover, the process to produce memory cards is made more efficient and less costly. Although an external package or body is not necessary, the instances could still be provided with an external package or body if so desired. Such a package or body would provide an external covering for the integrated circuit product and establish its external product features. For example, when the resulting memory cards are smaller than the desired form factor for the memory cards, the memory cards can be enclosed in an external package or lid to scale the memory cards to the desired form factor.

FIGS. 5A and 5B are flow diagrams of batch memory card processing 500 according to another embodiment of the invention. The batch memory card processing 500 is processing associated with producing integrated circuit products, namely, memory cards, that are fabricated about a leadframe.

The batch memory card processing 500 initially obtains 502 a multi-instance leadframe. The multi-instance leadframe is a conductive metal, such as copper. The leadframe is configured to include an array of individual instances about which the integrated circuit products are held together for batch processing. To provide a temporary base and to protect and support one surface of the multi-instance leadframe, a removable polymer tape is mounted 504 to the one side of the multi-instance leadframe. Then, a die attach material is placed 506 at a region of each instance of the multi-instance leadframe. The die attach material is typically a non-conductive adhesive.

Next, a memory die is mounted 508 on the die attach material at the region of each instance of the multi-instance leadframe. A controller die is mounted 510 on the memory die for each instance. Here, at each instance, the controller die is stacked on the memory die. Although not necessary, a die attach material can be placed between the controller die and the memory die to hold the controller die in place and/or to electrically isolate it from the memory die. Further, although the controller die is described as being stacked on the memory die for each instance, it should be understood that the controller die could also be placed alongside the memory die at each instance to provide a non-stacked configuration. The advantage of a stacked approach is, however, that the overall form factor of the memory card can be smaller.

Next, the memory dies and the controller dies are wire bonded 512 to the respective instances of the multi-instance leadframe. Here, pads or leads of the memory dies and the controller dies are electrically connected to their respective instances of the multi-instance leadframe through use of wires that are placed by a wire bonding process. A molding compound is then applied 514 to the mutli-instance leadframe and the components thereon. The molding compound serves to protect the components (e.g., dies) and their electrical connections to the multi-instance leadframe as well as to provide an external body for the memory cards. The application 514 of the molding compound can be performed in a variety of ways, one of which is referred to as transfer molding and another is referred to as flood molding.

Thereafter, the polymer tape can be removed 516 from the one side of the multi-instance leadframe. The side of the multi-instance leadframe that was protected by the polymer tape can then have its exposed leads plated 518 with a conductive material, such as gold. Additionally, an additional etching step can provide a slight etch to the leadframe to smooth out the corners or edges of the leadframe. Such a small etch can be referred to as a one-half etch.

Finally, each instance of the multi-instance leadframe is singulated 520 to form the individual memory cards. The singulation 520 of the instances defines the shape of the memory cards. After the instances have been singulated 520, the batch memory card processing 500 is complete and ends with a batch of the memory cards having been produced.

In one embodiment, the singulation 520 can utilize non-linear shaping. That is, in the singulation 520 of each of the memory cards, each of four sides are sawed, and in doing so, at least one of the sides includes a curvilinear portion that requires non-linear shaping in order to saw that side. Consequently, the individual instances of the memory cards that are produced in a batch have at least a portion of their housing or external structure having a non-linear shape. In other words, in this embodiment, the external structure or housing of the memory cards are not merely rectangular, but include at least one region that has a non-linear (or non-rectangular) shape. For example, in FIG. 2A, the integrated circuit product 200 includes the curvilinear region 202 that would correspond to the non-linear (or non-rectangular) shaped region. Advantageously, the singulation 520 can be performed in the same manufacturing site as the other operations of the batch memory card processing 500. Further, the ability to provide non-linear shaping/cutting beneficially allows the memory cards to be shaped in their final form through such singulation 520. Hence, in this embodiment, the external features of the memory cards, which are not merely rectangular (i.e., include at least one curvilinear region) can thus be determined by the sawing/cutting of the singulation 520. Following the singulation 520, the batch memory card processing 500 is complete and ends.

Similar to the embodiment illustrated in FIG. 4, a further external package or body (e.g., plastic lid) is not needed and thus the additional steps to form such packages or bodies and then to insert the instances into such packages or bodies are not required. Consequently, the process to produce memory cards is made more efficient and less costly. Although an external package or body need not be utilized, an external package or body, as noted above, can optionally be used to set the external product features. For example, when the resulting integrated circuit products are smaller than the desired form factor for the products, then enclosing the integrated circuit products in an external package or lid can scale the integrated circuit product to set the external product features, including setting the desired form factor.

The integrated circuit products according to the invention can be used in memory systems. The invention can further pertain to an electronic system that includes a memory system as discussed above. Memory systems are commonly used to store digital data for use with various electronics products. Often, the memory system is removable from the electronic system so that the stored digital data is portable. These memory systems can be referred to as memory cards. The memory systems according to the invention can have a relatively small form factor and be used to store digital data for electronics products such as cameras, hand-held or notebook computers, network cards, network appliances, set-top boxes, hand-held or other small audio players/recorders (e.g., MP3 devices), and medical monitors. Examples of memory cards include PC Cards (formerly PCMCIA devices), Flash Cards, Flash Disks, Multimedia Cards, and ATA Cards. As an example, the memory cards can use Flash type or EEPROM type memory cells to store the data. More generally, a memory system can pertain to not only a memory card but also a memory stick or some other semiconductor memory product.

The advantages of the invention are numerous. Different embodiments or implementations may yield one or more of the following advantages. One advantage of the invention is that integrated circuit products, such as memory cards, can be made smaller. For example, the memory cards can be sized with a chip scale package level. Another advantage of the invention is that assembly of integrated circuit products can be completely performed using a semiconductor assembly production line. Still another advantage of the invention is that a molding compound and a substrate or leadframe used in forming integrated circuit products can serve as an outer or external surface. Through sophisticated shaping of the outer or external surface, the integrated circuit products can be formed with curvilinear regions and/or small features. The small features can serve functional or ornamental purposes. Yet still another advantage of the invention is that integrated circuit products can be produced in a rapid and cost effective manner. Another advantage of the invention is that the form factor of the integrated circuit products (e.g., removable peripheral cards) can be set at the semiconductor assembly level. Still another advantage of the invention is that a surrounding plastic shell, body or frame becomes optional, which can reduces manufacturing time and cost when not used, and which can allow flexibly set external product features (e.g., form factor) when used.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A method for concurrently forming a plurality of integrated circuit products, said method comprising:
providing a multi-instance leadframe or substrate having a plurality of instances;
attaching one or more dies to each of the instances on at least one side of the multi-instance leadframe or substrate;
electrically connecting each of the one or more dies to the respective instance of the leadframe or substrate;
thereafter encapsulating together the plurality of instances on the at least one side of the multi-instance leadframe or substrate with a molding compound; and
subsequently singulating each of the plurality of instances using at least non-linear shaping of at least one region of each of the plurality of instances, thereby forming the integrated circuit products,
wherein the non-linear shaping of each of the instances by said singulating is achieved through curvilinear or non-rectangular cutting during said singulating.

2. A method as recited in claim 1, wherein said electrically connecting includes at least wire bonding each of the one or more dies to the respective instance of the leadframe or substrate.

3. A method as recited in claim 1, wherein said encapsulating forms a molded panel.

4. A method as recited in claim 1, wherein said singulating is performed by a laser beam provided by a laser.

5. A method as recited in claim 1, wherein said singulating is performed by a high pressure water jet.

6. A method as recited in claim 5, wherein the water jet includes at least water and an abrasive material.

7. A method as recited in claim 1, wherein the substrate is a printed circuit board.

8. A method as recited in claim 1, wherein the passive components include at least one of a resistor and a capacitor.

9. A method as recited in claim 1, wherein the one or more dies are semiconductor dies.

10. A method as recited in claim 1, wherein the integrated circuit products are memory cards.

11. A method as recited in claim 1, wherein the integrated circuit products are removable, non-rectangular peripheral cards.

12. A method as recited in claim 1, wherein said method further comprises:
attaching, prior to said encapsulating, one or more passive components to each of the instances.

13. A method as recited in claim 1, wherein said method further comprises:
applying a mark to the molding compound for each of the plurality of instances.

14. A method as recited in claim 13, wherein the mark is a printed mark.

15. A method as recited in claim 1,
wherein said encapsulating forms a molded panel, and
wherein said singulating of each of the instances cuts the molded panel into a plurality of molded packages which are the integrated circuit products.

16. A method as recited in claim 15, wherein the molded packages are memory cards.

17. A method as recited in claim 16, wherein said method further comprises:
applying a coating to each of the memory cards after said singulating.

18. A method as recited in claim 16, wherein said method further comprises:
affixing an outer casing to each of the memory cards after said singulating.

19. A method as recited in claim 1, wherein said method further comprises:
electrically testing the instances is performed after said encapsulating and before said singulating.

20. A method as recited in claim 1, wherein said method further comprises:
applying a coating to each of the instances after said singulating.

21. A method for concurrently forming a plurality of integrated circuit products, said method comprising:
providing a multi-instance leadframe or substrate having a plurality of instances;
attaching one or more dies to each of the instances on at least one side of the multi-instance leadframe or substrate;
electrically connecting each of the one or more dies to the respective instance of the leadframe or substrate;
thereafter encapsulating together the plurality of instances on the at least one side of the multi-instance leadframe or substrate with a molding compound;
subsequently singulating each of the plurality of instances using at least non-linear shaping of at least one region of each of the plurality of instances, thereby forming the integrated circuit products; and
applying a coating to each of the instances after said singulating.

22. A method for concurrently forming a plurality of integrated circuit products, said method comprising:
providing a multi-instance leadframe or substrate having a plurality of instances;
attaching one or more dies to each of the instances on at least one side of the multi-instance leadframe or substrate;
electrically connecting each of the one or more dies to the respective instance of the leadframe or substrate;
thereafter encapsulating together the plurality of instances on the at least one side of the multi-instance leadframe or substrate with a molding compound;
subsequently singulating each of the plurality of instances using at least non-linear shaping of at least one region of each of the plurality of instances, thereby forming the integrated circuit products; and
affixing an outer casing to each of the instances after said singulating.

23. A method for concurrently forming a plurality of integrated circuit products, said method comprising:
providing a multi-instance leadframe or substrate having a plurality of instances;
attaching one or more dies to each of the instances on at least one side of the multi-instance leadframe or substrate;
electrically connecting each of the one or more dies to the respective instance of the leadframe or substrate;
thereafter encapsulating together the plurality of instances on the at least one side of the multi-instance leadframe or substrate with a molding compound;
subsequently singulating each of the plurality of instances using at least non-linear shaping of at least one region of each of the plurality of instances, thereby forming the integrated circuit products; and
applying a coating to each of the instances after said singulating.

24. A method for concurrently forming a plurality of memory cards, each of the memory cards including at least a memory die and a controller die, said method comprising:
providing a multi-instance leadframe having a plurality of instances;
attaching the multi-instance leadframe on a removable tape;

placing die attach material on a portion of each of the instances of the multi-instance leadframe;

attaching the memory die to each of the instances via the die attach material corresponding to each of the instances;

affixing the controller die with respect to each of the instances;

electrically connecting each of the memory die and the controller die to the respective instances of the multi-instance leadframe;

thereafter encapsulating together the instances with a molding compound; and subsequently singulating each of the instances using at least non-linear shaping of at least one region of each of the plurality of instances.

25. A method as recited in claim 24, wherein the removable tape is a polymer tape.

26. A method as recited in claim 24, wherein said affixing operates, for each of the instances, to mount the controller die on the memory die, whereby the controller die is stacked on the memory die.

27. A method as recited in claim 24, wherein said method further comprises:

removing the removable tape after said encapsulating and before said singulating.

28. A method as recited in claim 27, wherein each of the instances include exposed electrical contacts as part of the leadframe of the respective instance.

29. A method as recited in claim 28, wherein said method further comprises:

plating the electrical contacts of each of the instances after said removing of the removable tape and before said singulating.

30. A method as recited in claim 24, wherein said electrically connecting includes at least wire bonding each of the memory die and the controller die to the respective instances of the multi-instance leadframe.

31. A method as recited in claim 24, wherein said singulating is performed by a laser beam provided by a laser.

32. A method as recited in claim 24, wherein said singulating is performed by a high pres sure water jet.

33. A method as recited in claim 32, wherein the water jet includes at least water and an abrasive material.

34. A method as recited in claim 24, wherein the memory cards are molded cards, each of the molded cards having a housing provided by the molding compound without any additional external casing.

35. A method as recited in claim 24, wherein the memory cards are removable, non-rectangular peripheral cards that provide data storage.

36. A method as recited in claim 24, wherein said encapsulating operates to encapsulate at least one side of the leadframe having the instances of the memory die and the controller die attached thereto, thereby encapsulating the memory die and the controller die.

37. A method as recited in claim 24, wherein the non-linear shaping of each of the instances by said singulating is achieved through curvilinear or non-rectangular cutting during said singulating.

38. A method as recited in claim 37, wherein said method further comprises:

affixing an outer external package about each of the instances after said singulating.

39. A method for concurrently forming a plurality of memory cards, each of the memory cards including at least a memory die and a controller die, said method comprising:

providing a multi-instance printed circuit board having a plurality of instances;

attaching the memory die with respect to each of the instances;

affixing the controller die with respect to each of the instances;

electrically connecting each of the memory die and the controller die to the respective instances of the multi-instance printed circuit board;

thereafter encapsulating together the instances with a molding compound; and subsequently singulating each of the instances using at least non-rectangular shaping.

40. A method as recited in claim 39, wherein said affixing operates, for each of the instances, to mount the controller die on the memory die, whereby the controller die is stacked on the memory die.

41. A method as recited in claim 40, wherein, for each of the instances, the memory die is mounted on the printed circuit board.

42. A method as recited in claim 39, wherein each of the instances include exposed electrical contacts on the printed circuit board.

43. A method as recited in claim 39, wherein said electrically connecting includes at least wire bonding each of the memory die and the controller die to the respective instances of the multi-instance printed circuit board.

44. A method as recited in claim 39, wherein said singulating is performed by a laser beam provided by a laser.

45. A method as recited in claim 39, wherein said singulating through use of a laser beam and water.

46. A method as recited in claim 39, wherein said singulating is performed by a high pressure water jet.

47. A method as recited in claim 46, wherein the water jet includes at least water and an abrasive material.

48. A method as recited in claim 39, wherein the memory cards are molded cards, each of the molded cards having a housing provided by the molding compound without any additional external casing.

49. A method as recited in claim 39, wherein the memory cards are removable peripheral cards that provide data storage.

50. A method as recited in claim 39, wherein said encapsulating operates to encapsulate at least one side of the printed circuit board having the instances of the memory die and the controller die attached thereto, thereby encapsulating the memory die and the controller die.

51. A method as recited in claim 39, wherein said method further comprises:

affixing an outer external package about each of the instances after said singulating.

* * * * *

UNITED STATES PATENT AND TRADEMARK OFFICE
CERTIFICATE OF CORRECTION

PATENT NO. : 7,094,633 B2
APPLICATION NO. : 10/602373
DATED : August 22, 2006
INVENTOR(S) : Hem P. Takiar

It is certified that error appears in the above-identified patent and that said Letters Patent is hereby corrected as shown below:

Col. 11, line 62 (claim 17, line 3), "memory cards" should be --instances--.

Col. 13, line 39 (claim 32, line 2), "pres sure" should be --pressure--.

Signed and Sealed this

Thirty-first Day of March, 2009

JOHN DOLL
*Acting Director of the United States Patent and Trademark Office*